(12) United States Patent
Takeichi et al.

(10) Patent No.: US 6,611,065 B2
(45) Date of Patent: Aug. 26, 2003

(54) CONNECTION MATERIAL

(75) Inventors: Motohide Takeichi, Kanuma (JP); Junji Shinozaki, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/987,396

(22) Filed: Nov. 14, 2001

(65) Prior Publication Data
US 2002/0098319 A1 Jul. 25, 2002

(30) Foreign Application Priority Data
Nov. 30, 2000 (JP) ........................................ 2000-365170

(51) Int. Cl.$^7$ ................................................ H01L 23/29
(52) U.S. Cl. ................. 257/789; 257/795; 174/259; 174/260; 252/512; 361/749; 361/751
(58) Field of Search .................................. 428/355, 356; 174/259, 260; 228/180.72, 215; 361/749, 751; 257/789, 795; 252/512

(56) References Cited

U.S. PATENT DOCUMENTS

| | | | | |
|---|---|---|---|---|
| 5,143,785 A | * | 9/1992 | Pujol et al. | 428/352 |
| 5,672,400 A | * | 9/1997 | Hansen et al. | 428/40.1 |
| 5,686,703 A | * | 11/1997 | Yamaguchi | 174/259 |
| 5,975,420 A | * | 11/1999 | Gogami et al. | 235/492 |
| 6,349,872 B1 | * | 2/2002 | Yamada et al. | 228/175 |

* cited by examiner

*Primary Examiner*—Cathy Lam
(74) *Attorney, Agent, or Firm*—Oliff & Berridge, PLC

(57) ABSTRACT

The present invention is a connection material which enables a flexible circuit board to be connected to a bare IC chip without causing a shoulder touch effect. The connection material contains an insulating adhesive and a flaky or fibrous insulating filler dispersed therein is used for connecting a film-like flexible circuit board and a bare IC chip. The aspect ratio of the flaky or fibrous insulating filler is no less than 20.

10 Claims, 2 Drawing Sheets

CONNECTION MATERIAL

BACKGROUND OF THE INVENTION

1. Field of the Invention

The present invention relates to a connection material for connecting a flexible circuit board to a bare IC chip, this connection material causing substantially no shoulder touch effect.

2. Description of the Related Art

Tape carrier packages (TCP) in which a driver IC was mounted onto a tape-like substrate have been used for the manufacture of liquid-crystal display element modules, but in order to meet the requirements imposed by the transition to a narrower wiring pitch and to facilitate processing operations in assembling with a liquid-crystal display element module, a CHIP ON FILM (COF) method came to use, this method involving face-down direct mounting of a bare IC chip onto a conductor pattern of a film-like flexible circuit board which is even thinner than the tape-like substrate for TCP.

In such COF connection, as shown in FIG. 3, a bump 5 of a bare IC chip 4 is positioned against a conductor pattern 2 of a film-like flexible circuit board 3 containing an insulating film 1 and the conductor pattern 2 formed thereon, an anisotropically electroconductive film 6 in which conductive particles for anisotropically electroconductive connection are dispersed in a thermosetting adhesive film is sandwiched therebetween and bonded under pressure and heating.

If the bare IC chip 4 is connected by using the anisotropically electroconductive film 6, the insulating film 1 of the film-like flexible circuit board 3 undergoes thermal shrinkage after the connection and, as shown in FIG. 4, the flexible circuit board 3 located outside the bare IC chip 4 warps toward the bare IC chip 4. Since the bump height of bare IC chip 4 has been about 20 μm the bare IC chip 4 has not been brought in connection with the conductor pattern 2 of the flexible circuit board 3.

However, as the wiring rule of IC chips was further refined, the number of terminals was increased, the terminal pitch was made smaller, the bump diameter of bare IC chips was reduced, and the bump height was also greatly decreased to about half of that in the conventional structures. As a result, as shown in FIG. 5, the bare IC chip 4 was sometimes brought in connection with the conductor pattern 2 of the flexible circuit board 3. Since a passivation film 7 is formed on the lower surface of bare IC chip 4, no short circuit occurs despite the connection, but the problem is that because the passivation film 7 cannot be formed on the scribe line portion 8 provided to cut out the bare IC chip 4 from the wafer, short circuit sometime occurred, in particular, in the shoulder edge portion 9 of bare IC chip (shoulder touch effect) and the insulation resistance between the adjacent conductor patterns 2 decreased significantly.

SUMMARY OF THE INVENTION

An object of the present invention is to provide a connection material which causes no shoulder touch effect when a flexible circuit board is connected to a bare IC chip.

The inventors have found that the object of the present invention can be attained by admixing a flaky or fibrous insulating filler to a connection material for connecting a film-like flexible circuit board and a bare IC chip. This finding led to the completion of the present invention.

Thus, the present invention provides a connection material for connecting a flexible board to a bare IC chip, comprising an insulating adhesive and a flaky or fibrous insulating filler dispersed therein.

DESCRIPTION OF THE PREFERRED EMBODIMENTS

The present invention will be described in detail hereinbelow.

Figure 1:
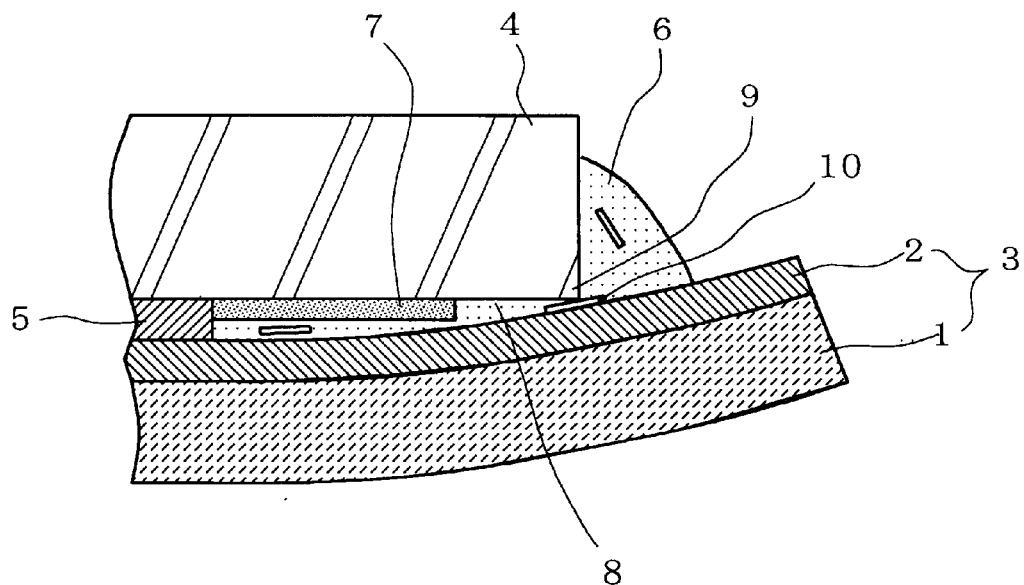
FIG. 1 is a partially expanded view of a shoulder edge portion of a bare IC chip and flexible circuit board connected by using the connection material in accordance with the present invention.

The connection material in accordance with the present invention is employed for connecting a flexible circuit board and a bare IC chip and has a flaky or fibrous insulating filler dispersed in an insulating adhesive. When a flaky or fibrous insulating filler 10, as shown in FIG. 1, is sandwiched between a shoulder edge portion 9 of a bare IC chip 4 and a conductor pattern 2 of a flexible circuit board 3, it can be easily stopped in this area, without being pushed out. Therefore, the direct connection between the two aforesaid components (shoulder touch effect) can be prevented. A spherical insulating filler has a very high mobility when it is sandwiched between the two aforesaid components and, therefore, the shoulder touch effect cannot be prevented.

Figure 2A:
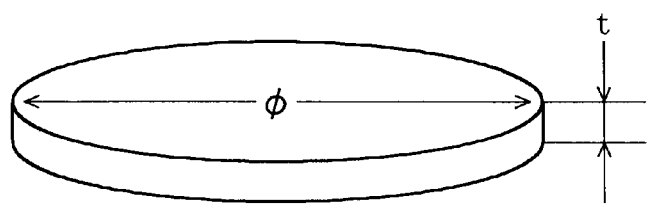
FIG. 2A is a perspective view of the flaky insulating filler.
Figure 2B:
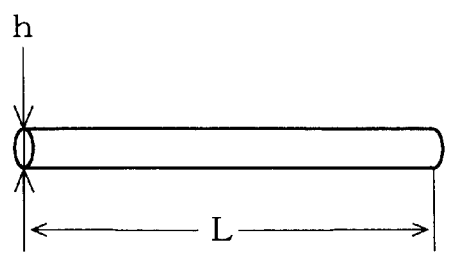
FIG. 2B is a perspective view of a fibrous insulating filler used in accordance with the present invention.
Figure 3:
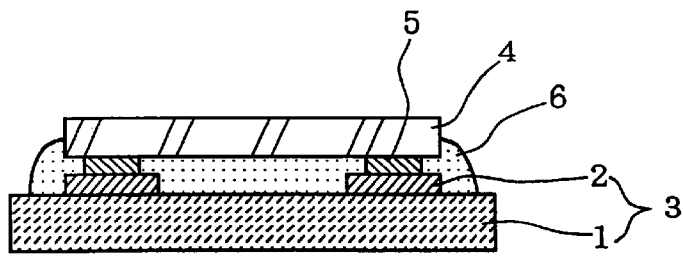
FIG. 3 illustrates a conventional COF connection.
Figure 4:
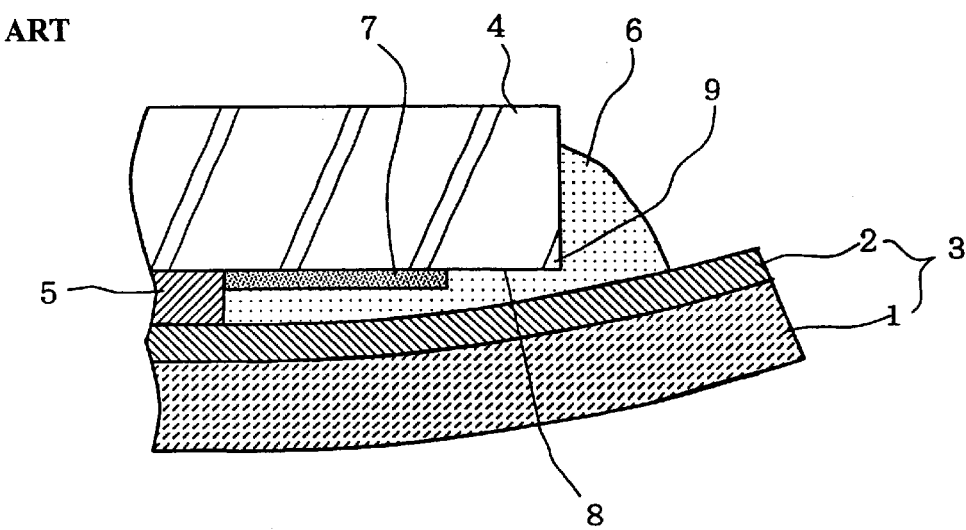
FIG. 4 illustrates drawbacks of the conventional COF connection.
Figure 5:
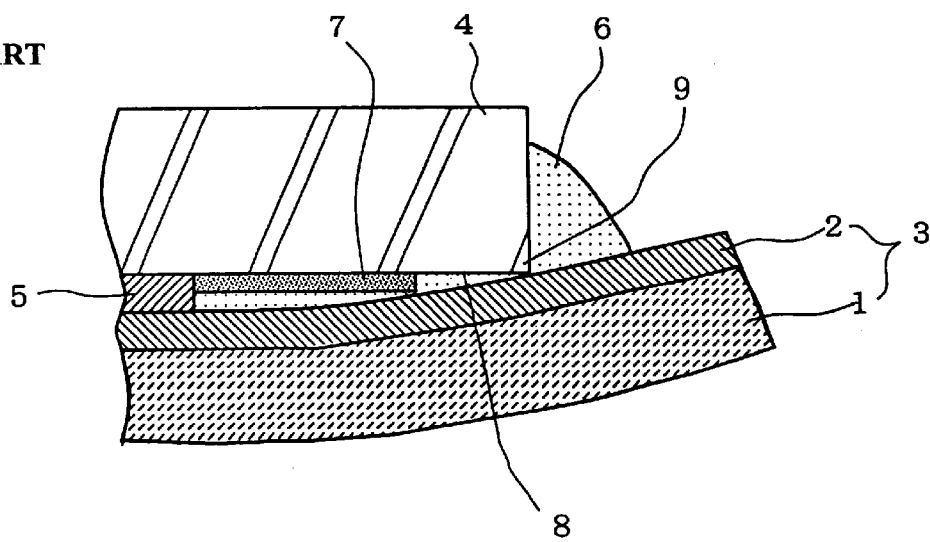
FIG. 5 illustrates drawbacks of the conventional COF connection.

It is preferred that the flaky or fibrous insulating filler 10 used in accordance with the present invention has an aspect ratio of no less than 20, even more preferably, no less than 30, so that the filler can be easily sandwiched between the shoulder edge portion 9 of bare IC chip 4 and the conductor pattern 2 of the flexible circuit board 3, without being pushed out therefrom. In case of flaky insulating filler, as shown in FIG. 2A, the aspect ratio is defined as a Φ/t ratio, where t stands for a thickness and Φ stands for a plane size (corresponds to a diameter when the plane approaches a circle). On the other hand, in case of a fibrous insulating filler, as shown in FIG. 2B, it is defined as L/h where h stands for a diameter and L stands for a length.

Furthermore, when conductive particles for anisotropically electroconductive connection are admixed to the connection material, on the premise that the aspect ratio is no less than 20, it is preferred that the thickness (t) of the flaky insulating filler be no more than 3 μm and the plane size (Φ) be no more than 60 μm in order to avoid unfavorable situations in which the electroconductive particles impede the electric connection. Further, it is preferred that the diameter (h) of the fibrous insulating filler be no more than 1 μm and its length (L) be no more than 20 μm.

Specific examples of the above-described flaky insulating filler include mica, talc, bentonite and the like. From the standpoint of filling properties and electric insulating properties, mica is preferred among them. Furthermore, specific examples of the fibrous insulating filler include potassium titanate whiskers, glass fibers, aluminum borate whiskers, aramide fibers, silicon carbide whiskers and the like. From the standpoint of availability and physical properties of the mixture, potassium titanate whiskers are the preferred filler.

If the compounded amount of the insulating filler in the connection material in accordance with the present invention is too small, then the shoulder touch effect cannot be effectively prevented, and if it is too large, then the filler impedes the electric connection. Therefore, the content of the insulating filler is preferably 5–95 wt. parts, even more preferably, 20–90 wt. parts per 100 wt. parts of the components other than the insulating filler, for example, insulating adhesive and the like.

Insulating adhesives that have been conventionally used for connecting flexible circuit boards and bare IC chips can be used as the insulating adhesive employed in the connection material in accordance with the present invention. Such insulating adhesives can be composed of various thermosetting resins, for example, (meth)acrylate copolymers, ethylene—acrylate copolymers, ethylene acrylic acid copolymer, ethylene vinyl acetate copolymer, polyethylene, ethylene—propylene copolymer, acrylonitrile—butadiene copolymer, styrene—butadiene block copolymer, styrene—butadiene—styrene block copolymer, carboxylated styrene—ethylene—butadiene—styrene block copolymer, epoxylated styrene—ethylene—butadiene—styrene block copolymer, styrene—isoprene block copolymer, polybutadiene, ethylene—styrene—butylene block copolymer, poly(vinyl butyral), poly(vinyl formal), phenoxy resins, polyesters, polyurethane, polyamide, poly(vinyl acetal), polyvinyl ether, polysulfone, NBR, SBR, chloroprene rubber, cyanate ester copolymers, epoxy resins, silicone resins, phenolic resins and the like. Photocurable resins can also be used. These compounds can be used individually or in combination of two or more thereof. If necessary, a curing agent or curing catalyst can also be used.

Furthermore, ordinary additives, for example, tackifiers, antioxidants, dispersants and the like can be compounded, if necessary, with the connection material in accordance with the present invention. Examples of tackifiers include terpene resins, terpene phenolic resins, rosins, xylene resins, alkylphenolic resins, dicyclopentadiene resin, chroman resin, aromatic hydrocarbon resins and the like. Examples of antioxidants include alkylphenols, mercapto compounds, phosphites, amines and the like. Examples of dispersants include nonionic, cationic, anionic, and amphoteric surfactants.

The conductive particles for anisotropically electroconductive connection are introduced in the connection material in accordance with the present invention when it is to be employed as an anisotropic connection material. Conductive particles for anisotropically electroconductive connection that have been conventionally used for anisotropically electroconductive connection can be employed as the aforesaid particles. Examples of such particles include metal particles such as particles of gold, nickel, solders and the like, particles obtained by plating and covering the resin polymer cores with a metal or such particles in which the surface of the plated metal is further coated with an insulating layer. The diameter of such conductive particles can be appropriately selected.

It can be anticipated that if the compounded amount of such conductive particles for anisotropically electroconductive connection is too small, a reliable conductivity will be difficult to guarantee, and if it is too high, the particles will contact each other and anisotropic connection will be difficult. For this reason, the amount of the conductive particles for anisotropically electroconductive connection is 1–20 wt. parts, preferably, 3–12 wt. parts per 100 wt. parts of the connection material prior to the addition of conductive particles for anisotropically electroconductive connection.

The connection material in accordance with the present invention can be manufactured by dispersing the flaky or fibrous insulating filler in the insulating adhesive by an ordinary method. An anisotropically electroconductive connection material can be manufactured by further dispersing conductive particles for anisotropically electroconductive connection. If necessary, such connection materials can be used in the form of a film, a paste, or a viscous liquid.

The connection structure obtained by connecting a flexible circuit board and a bare IC chip by using the connection material or anisotropically electroconductive connection material in accordance with the present invention demonstrates high reliability of connection and prevents a shoulder touch effect. A flexible circuit board and bare IC chip identical to conventional ones can be used as the aforesaid flexible circuit board and bare IC chip, but bare IC chips with an especially low bumps or flexible circuit boards with a narrow wiring pitch can also be used.

EXAMPLES

The present invention will be described below in greater detail based on the following Examples and Comparative Examples.

Examples 1–7 and Comparative Examples 1–4

An anisotropically electroconductive connection film was fabricated by homogeneously mixing the components shown in Table 1 by an ordinary method in 30 wt. parts of toluene, coating the mixture obtained on a silicone-treated polyethylene terephthalate film to a dry thickness of 30 μm, and drying.

The fabricated anisotropically electroconductive connection film was positioned and sandwiched between an IC chip with a bump pitch of 85 μm (chip size 6.3×6.3 mm, plated bump size 45×45 μm, bump spacing 40 μm, bump height 10 μm) and a polyimide insulating film having a thickness of 25 μm and provided with copper pattern terminals (with Ni/Au plating) with a thickness of 12 μm. A connection structure was then obtained by press bonding for 10 s under a pressure of 160 N at a temperature of 190° C. The initial contact resistance of copper pattern terminals and insulation resistance between IC chip and per pattern terminals were determined by a four-terminal hod. The results obtained are shown in Table 2.

The lower is the initial contact resistance the better, the desired value is actually no more than 100 mΩ. Furthermore, the higher is the insulating resistance the better, and the desired value is actually no less than $1\times10^6 \Omega$.

TABLE 1

(wt.)

| Components | Example | | | | | | | Comp. Example | | | |
|---|---|---|---|---|---|---|---|---|---|---|---|
| | 1 | 2 | 3 | 4 | 5 | 6 | 7 | 1 | 2 | 3 | 4 |
| Epoxy resin A*[1] | 43 | 43 | 43 | 43 | 43 | 43 | 43 | 43 | 43 | 43 | 43 |
| Epoxy resin B*[2] | 20 | 20 | 20 | 20 | 20 | 20 | 20 | 20 | 20 | 20 | 20 |
| Amine curing agent*[3] | 25 | 25 | 25 | 25 | 25 | 25 | 25 | 25 | 25 | 25 | 25 |
| Conductive particles*[4] | 12 | 12 | 12 | 12 | 12 | 12 | — | 12 | 12 | 12 | 12 |
| Flaky insulating filler*[5] | 10 | 30 | 80 | — | — | — | 80 | — | — | — | — |
| Fibrous insulating filler*[6] | — | — | — | 10 | 30 | 80 | — | — | — | — | — |
| Spherical insulating filler*[7] | — | — | — | — | — | — | — | 10 | 30 | 80 | — |

*[1]Epicoat 1009, manufactured by Yuka Shell Epoxy K.K.
*[2]Epicoat 828, manufactured by Yuka Shell Epoxy K.K.
*[3]3941HP, manufactured by Asahi Chemical Industry Co., Ltd.
*[4]Bright 20GNR, manufactured by Nippon Gosei Kagaku K.K.
*[5]Micromica MK-100, manufactured by Co-Op Chemical Co. (t = 1 μm, Φ = 35 μm, aspect ratio (t/Φ) = 35)
*[6]TISMO-D, manufactured by Otsuka Chemical Co. (h = 0.5 μm, L = 15 μm, aspect ratio (h/L) = 30)
*[7]SO-E5, manufactured by Tatsumori Ltd.

TABLE 2

| | Initial contact resistance (mΩ) | Insulation resistance (Ω) |
|---|---|---|
| Example | | |
| 1 | 7 | more than $1 \times 10^8$ |
| 2 | 7 | more than $1 \times 10^{10}$ |
| 3 | 8 | more than $1 \times 10^{10}$ |
| 4 | 7 | more than $1 \times 10^8$ |
| 5 | 8 | more than $1 \times 10^{10}$ |
| 6 | 8 | more than $1 \times 10^{10}$ |
| 7 | 7 | more than $1 \times 10^{10}$ |
| Comparative Example | | |
| 1 | 7 | less than $1 \times 10^6$ |
| 2 | 7 | less than $1 \times 10^6$ |
| 3 | 7 | less than $1 \times 10^6$ |
| 4 | 7 | less than $1 \times 10^6$ |

As shown in Table 2, connection materials of the Examples 1–7 that contain flaky or fibrous insulating filler are preferred for practical applications in terms of both initial contact resistance and insulation resistance.

By contrast, connection materials of Comparative Examples 1–4 that contained a spherical insulating filler and no flaky or fibrous insulating filler were satisfactory from the standpoint of initial contact resistance, but their insulation resistance was less than $1\times10^6\Omega$ and it is clear that the shoulder touch effect cannot be completely prevented.

When a flexible circuit board and a bare IC chip are connected with the connection material in accordance with the present invention, the connection can be conducted without a shoulder touch effect.

What is claimed is:

1. A connection material for connecting a flexible circuit board to a bare IC chip, comprising an insulating adhesive, and a flaky or fibrous insulating filler dispersed therein wherein the aspect ratio of the flaky or fibrous insulating filler is at least 20.

2. The connection material according to claim 1, wherein the flaky insulating filler is mica.

3. The connection material according to claim 1, wherein the fibrous insulating filler is a potassium titanate whiskers.

4. The connection material according claim 1, wherein the insulating filler is contained in the connection material in an amount of 20–90 wt. % parts per 100 wt. parts of components other than the insulating filler.

5. An anisotropically electroconductive connection material comprising 1–20 wt. parts of conductive particles for anisotropically electroconductive connection per 100 wt. parts of the connection material according to claim 1.

6. A connection structure in which a flexible circuit board is connected to a bare IC chip with the connection material according to claim 1.

7. A connection structure in which a flexible circuit board is connected to a bare IC chip with the anisotropically electroconductive connection material according to claim 5.

8. The connection material according to claim 1, wherein the flaky insulating filler is mica.

9. The connection material according to claim 1, wherein the fibrous insulating filler is a potassium titanate whiskers.

10. The connection material according to claim 1, wherein the insulating filler is contained in the connection material in an amount of 20–90 wt. parts of components other that the insulating filler.

* * * * *